MINIATURE CIRCUIT CONNECTION AND PACKAGING TECHNIQUES

Filed Aug. 18, 1967 4 Sheets-Sheet 1

INVENTOR
FRANK J. ARDEZZONE
BY
Harvey G. Lowhurst
ATTORNEY

INVENTOR
FRANK J. ARDEZZONE

BY Harvey J. [signature]

ATTORNEY

MINIATURE CIRCUIT CONNECTION AND PACKAGING TECHNIQUES

Filed Aug. 18, 1967 4 Sheets-Sheet 3

INVENTOR
FRANK J. ARDEZZONE

BY Harvey J. [signature]

ATTORNEY

INVENTOR
FRANK J. ARDEZZONE
BY Harvey J. Lowhurst
ATTORNEY

United States Patent Office 3,497,947

Patented Mar. 3, 1970

3,497,947

MINIATURE CIRCUIT CONNECTION AND PACKAGING TECHNIQUES

Frank J. Ardezzone, P.O. Box 242, Santa Clara, Calif. 95052

Filed Aug. 18, 1967, Ser. No. 661,634
Int. Cl. B01j *17/00;* H01l *1/16*
U.S. Cl. 29—577 11 Claims

ABSTRACT OF THE DISCLOSURE

A semiconductor packaging method and machine utilizes metal lead members surrounded on three sides by a transparent insulating member to form leads for connecting to pads on semiconductor devices. The metal leads are flush with one surface of the insulating member so that the preform leads directly contact the pad areas on the device. Alignment of the pad areas with the preform may be observed through the transparent member and the resulting junction welded without the use of solder or other agents by a high energy beam projected through the member.

BACKGROUND OF THE INVENTION

Field of the invention

This invention relates in general to semiconductor connecting and packaging, and relates more particularly to such connecting and packaging for semiconductor devices having a large number of leads thereto and for interconnecting a large number of such devices.

Description of the prior art

One prior art method of packaging semiconductor devices utilizes a plurality of devices in a single container, with the leads interconnected by standard wire bonding techniques. In this method, leads are connected to the pads on the devices and to terminal posts or strips by means of a ball bond. In this type of bond, the lead wire is carried in a capillary device and the wire end is passed through a fine flame to sever the wire below the capillary and form an enlarged "ball" on the wire end. This ball is then pressed onto the pad by the capillary, while heat is applied to the pad area, to form a thermal-compression bond of the ball to the pad. The capillary is then raised, and the wire is pressed against the terminal strip or post to form a connection at the other end.

Regardless of whether this ball bonding technique is used with a can type package or a flat package, there are numerous problems connected therewith. From a mechanical and electrical standpoint, the thermal-compression bond is not as desirable as a pure weld because it is weaker and of higher electrical resistance. The unsupported lead extending from the pad of the device to the post of the can type package or the terminal strip or lead of the flat package will often pull loose when subjected to G loading or to shock testing. Physically, it becomes extremely difficult to interconnect several pads (such as 12) by this technique without shorting various connections, and it becomes impossible to interconnect very large numbers of pads because the distances which must be traversed between interconnections become extremely large and cross-overs become very numerous, so that the probability of shorting and mechanical failure is quite high.

In an effort to solve some of the above problems, the so-called "flip chip" technique has been developed. In this approach, a package member is employed having pads or interconnect preforms and leads placed so as to form a mirror image of the pads on the device to be connected. The chip is then "flipped" over onto the package member so that the chip pads are aligned with the package pads, and the matching pads are soldered togeth r by special pellet solder techniques. This technique does eliminate the need for making a ball bond to the device pads, but it still has several shortcomings. The requirement of a solder pellet to connect and bond the chip pads and package member still results in a large number of mechanical failures, and the use of a soldering agent between the interconnect preform and the chip pads requires that proper flow and wetting conditions prevail for all pads of all chips interconnected. Additionally, there is no way of readily inspecting the integrity of the connections once the assembly is made because the connections are hidden by the member carrying the interconnect preforms. For these reasons, this technique has been limited in use to approximately 12 devices with 8 pads per device. With the increasing use of hybrid circuits, with their large number of connections required both within the devices and externally thereto, these prior art methods have not been completely satisfactory.

SUMMARY OF THE INVENTION

The present invention solves the problems of the prior art techniques of numerous production steps, elaborate and complicated equipment and uncertain results. In the present invention, planar metal preform members are employed having tip portions which are shaped to the desired configuration to match the configuration of pads on the device to be connected. These preform members are secured to a member of optically transparent material. Preferably, the optically transparent material is glass, and the preform members are placed in the glass so as to be surrounded thereby on three surfaces of the tip portions, with the fourth or exposed surface of the preform member being flush with one surface of the glass. The ends of the preform leads opposite to the tip portions extend out of the glass envelope for making external connections to the device. A semiconductor device is then positioned so that the pads thereon are aligned with and pressed against the tip portions. The device pads and tip portions of the preform leads are then welded or joined together without the introduction of any material into the area of the junction, preferably by passing a suitable high energy beam, such as a laser, through the glass envelope to strike the tip portions on the side opposite to the device. The beam is of suitable energy to perform a welding of the metals of the device pads and the preform leads, and this welding is accomplished without the introduction of any soldering agents or the like.

After this welding, the package is sealed by placing another glass layer over the top of the device and mating it with the preform and the previously assembled glass package. This results in the device and the preform being totally encased in glass, thus eliminating any possibility of failure due to shock loading except for a structural collapse of the package.

The above technique provides for the connection of the preform lead members to the semiconductor pads for making connections between the device and external circuits. To provide for interconnection between pads of a given device or between pads of different devices, where there is insufficient space available across the surfaces of the devices to make the desired interconnections without shorting existing leads or resulting in excessively long electrical paths, a novel technique of this invention may be employed. This technique employs two substrates, a primary substrate carrying a metal pattern corresponding to the connections to the device, and a secondary substrate carrying a metal pattern corresponding to desired interconnections between device pads which cannot be made on the surface of the primary substrate because of space or path length limitations.

The secondary metal pattern is connected to selected parts of the primary metal pattern through openings in the primary substrate, so that the secondary metal pattern provides the desired electrical connection between the selected points on the primary metal pattern. After this joining of the secondary metal pattern to the primary metal pattern, the semiconductor device itself may be connected to the primary metal pattern by placing the device pads in contact with the appropriate parts of the primary metal pattern. The pads are joined to the primary metal pattern preferably by welding which is accomplished by passing a high energy beam (e.g., laser beam) through the primary and secondary substrates to strike the interface and cause the metals to fuse. The device pads are thus joined to the appropriate parts of the primary metal pattern and are interconnected in the desired manner through the connections of the secondary metal pattern. This can be accomplished by using one or many devices and one or a plurality of secondary substrates.

To complete the fabrication of this type of package, connections may then be made to the ends of the primary metal pattern leads through a glass-preform lead member as described above. This glass-preform member has its tips placed in contact with the ends of the primary metal pattern on the primary substrate, and these portions are joined together by passing a high energy beam through the glass portion to bond the preform leads to the primary metal leads. The assembly may then be provided with a glass cover member, as described above, to completely encase and protect the package.

The techniques of the present invention eliminate the need for any wire bonding operation, and they increase the structural integrity of the package and electrical interconnections by providing one bonded and one welded surface as compared to the prior art use of two bonded and two welded surfaces. Additionally, by utilizing a plurality of high energy beams which may be operated simultaneously, all of the bonding connections for a given package may be made at once, thus eliminating the step-by-step bonding operations required by the prior art methods. Further, the present invention is adapted for use in semi-automatic or automatic equipment which positions the preform member relative to the semiconductor device prior to firing the high energy beam.

It is therefore an object of the present invention to provide an improved method of assembling semiconductor packages.

It is a further object of this invention to provide a method of assembling semiconductor packages which does not require the use of wire bonding techniques.

It is an additional object of the present invention to provide a method of assembling semiconductor packages which readily permits the connection of a large number of leads to and within the package.

It is a further object of this invention to provide a method and machine for assembling semiconductor packages which enables a plurality of connections to be made simultaneously within the package.

It is an additional object of this invention to provide a method of assembling semiconductor packages permitting the use of a plurality of interconnections and cross-over interconnections.

DESCRIPTION OF THE PREFERRED EMBODIMENT

Figures 1, 2, 3, 4, 6:
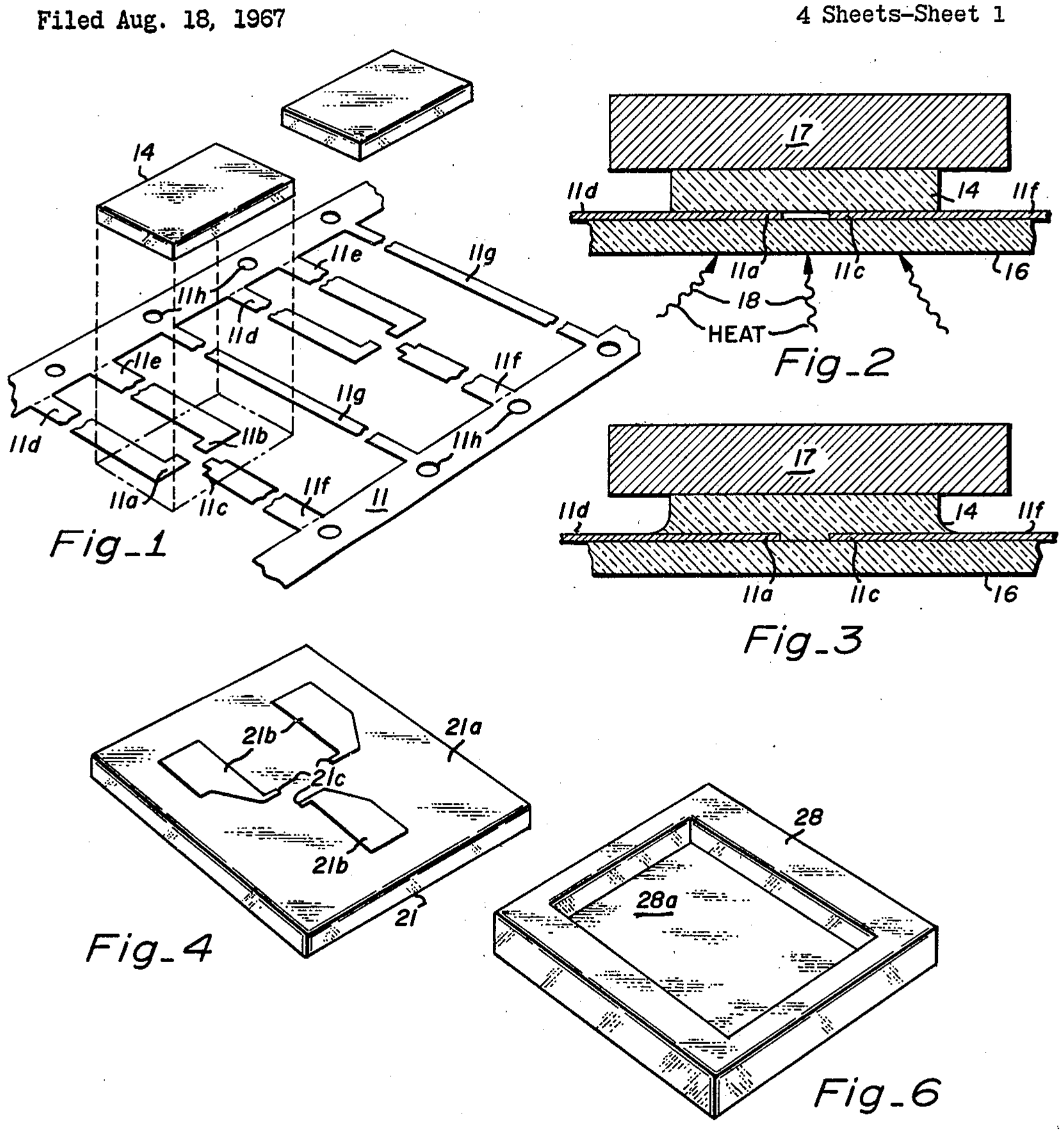
FIG. 1 is a perspective view of preform members and blocks of transparent material in accordance with this invention.
FIG. 2 is a diagram illustrating the method of applying heat and pressure to the block member to cause it to flow around the preform member.
FIG. 3 is a diagram showing the position of the block member after the application of heat and pressure as in FIG. 2.
FIG. 4 is a perspective view of a typical semiconductor device having pads for connection to the ends of a preform member in accordance with this invention.
FIG. 6 is a perspective view af a recessed block of transparent material for encapsulating the device and preform member after welding.

Referring to FIG. 1, the method of the invention is illustrated in connection with a sheet of preform material 11. In FIG. 1, preform material 11 has already been provided with the lead pattern therein, and this lead pattern may include lead members having tip portions 11*a*, 11*b*, 11*c* which are to be connected to the corresponding pads on a semiconductor device, and end portions 11*d*, 11*e*, 11*f* for connection to external circuits. Although only three such lead members are shown for purposes of simplicity, it will be understood that any number of such leads may be provided and that the present invention is particularly advantageous with large numbers of such leads, as discussed above.

Preform 11 may be of any suitable material, such as the metal material identified as Kovar, which is a nickel, cobalt and iron alloy manufactured by Westinghouse, or the material Neyoro G, which is a gold alloy sold by Ney Metals Co., Inc. The lead pattern may be provided in the preform material by any suitable technique known in the art, such as by chemical etching using photoresist methods, or electric discharge machining.

In addition to the lead members, perform member 11 is provided with ribs 11*g* which serve to provide structural rigidity for the preform member during the fabrication steps. If the method of this invention is practiced on automatic or semiautomatic machinery, the preform material is preferably arranged in strip form as shown in FIG. 1, so that a plurality of devices may be connected and encapsulated on a given strip. In this connection, the external end portions 11*d*, 11*e*, 11*f* may remain a part of the preform material, as shown by the dotted lines, until they are separated after encapsulation. Additionally, index or registration holes 11*h* may be provided along the length of material 11 to provide for accurate movement and positioning of the material.

The transparent envelope to be placed on three sides of the preform member may be in the form of a block 14 which is placed on the preform member, in the position indicated by the dotted lines of FIG. 1. Block 14 may be of glass or any other suitable transparent and electrically insulating material. FIG. 2 diagramatically illustrates one method for forming block 14 around preform member 11. Preform member 11 rests on a planarizing plate 16 and a loading force is applied to the top of glass block 14 by some means, represented by loading member 17. Heat is applied to the structure, as shown by the arrows 18, in an amount sufficient to cause block 14 to soften and flow under the action of the force applied by member 17, so that the material of block 14 flows around tip portions 11*a*, 11*b*, 11*c*, as shown in FIG. 3. The work surface in the form of planarizing plate 16 insures that the preform leads remain flat during the application of the heat and loading force. This step in the operation is preferably carried out in an inert atmosphere, such as argon or nitrogen, to prevent any oxidation of the preform lead members.

Upon completion of this step, the tip portions of the preform leads are encased in glass on three surfaces, with the fourth surface of the preform leads in-plane or flush with the surface of the glass. This is clearly seen from FIG. 3, where the preform lead surfaces resting on planarizing plate 16 are flush with the surface of glass block 14 which has flowed around the leads. The ends 11*d*, 11*e*, 11*f* of the lead members opposite to tip portions 11*a*, 11*b*, 11*c* extend outside glass block 14 for the purpose of making electrical connections to the outside circuitry.

The next step in the procedure is to bond the tip portions of the preform leads to the pads on a semiconductor device. Such a typical semiconductor device is illustrated in FIG. 4 and includes a device 21 having a surface 21*a* with 3 pads 21*b* thereon. As is well-known in the art, pads 21*b* are formed of an electrical conductive material and serve as connecting points between the diffused semiconductor elements within the device and the external circuit leads (in this case, the preform lead members 11*a*, 11*b*, 11c). Pads 21*b* are generally of aluminum (although other metals are used) and formed by first depositing onto the entire surface 21*a* a thin layer of metal, and then selectively removing the metal from all but the areas of pads 21*b* and tip portions 21*c* which are connected to the semiconductor elements.

Figure 5:
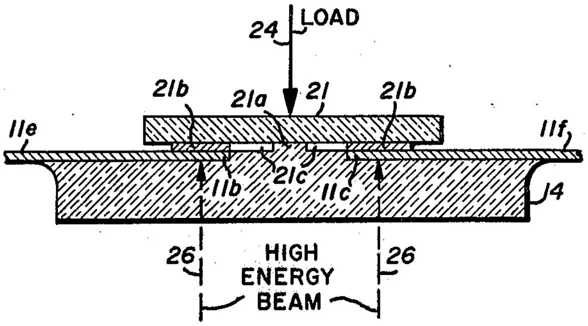
FIG. 5 is a diagram showing the positioning of the semiconductor device relative to the preform member during welding.

To make the connections betwen the device and tip portions of the preform leads, the elements are positioned as shown in FIG. 5, with surface 21*a* of the semiconductor device facing the flush surface of the preform leads and glass block 14. Although the drawing illustrates the semiconductor device above the preform leads and glass block, it will be understood that their relative positions could be reversed if desired. The semiconductor device is positioned so that pads 21*b* are aligned with and in engagement with tip portions 11*a*, 11*b*, 11*c*. This alignment and engagement is facilitated when block 14 is transparent so that the mating of the pads with the preform leads may be observed through the material, either by the naked eye or with optical aids such as a microscope.

When the pads are properly aligned with the preform leads, these elements are pressed firmly together, as shown by the force vector 24, and a suitable high energy beam applied through block 14 to weld or marry the tip portions to the pads. This high energy beam may be of any suitable type, such as an electron beam, but preferably a laser beam is employed because of its highly localized heating effect and the fact that it does not have to be operated in a vacuum. This high energy beam, represented by dotted arrows 26, is directed through block 14 to the side of the tip portions away from device 21, and little or no heating occurs in glass block 14 because it is essentially transparent to the laser beam. One laser may be employed to successively perform all the welding operations by moving the assembly or laser beam between welding operations to locate the junction to be welded and the focus of the laser beam. Alternatively, a plurality of laser beams may be employed either by the use of beam splitting techniques or by employing multiple lasers, to simultaneously perform all welding operations on a given device. This latter approach is particularly attractive for automatic or semiautomatic operations where the multiple laser beams can be prefocused at the desired junction points and all welding done at once after the device and preform assembly are properly positioned. Under any circumstances, this welding step is preferably performed in an inert atmosphere to prevent the possibility of oxidation of the device pads or preform leads.

The techniques discussed above have been practiced using a Korad laser of the ruby rod type. Satisfactory operation was accomplished at 0.05 joules, with a pulse length of 2.0 to 3.0 milliseconds and a beam focus of 0.040 inch. The thickness of materials was 3 thousandths (.003) of an inch for the preform and 50 thousand angstroms for the aluminum pad on the semi-conductor.

After this welding operation, the encapsulation of the assembly is completed by placing a glass member over the device to completely seal it. Such a glass member may be either a solid block, such as block 14 in FIG. 1, or a block 28 having a recess 28*a* therein corresponding to the dimensions of device 21, as shown in FIG. 6. When using a block such as block 14, it will be realized that the material must be made to flow around the device (as was the case when the preform was encased). In order to accomplish this, the material may be heated and loaded as previously described. This method will suffice where the die volume is small in relation to the package. In cases where the die volume is high, recessed block 28 will be used.

Figure 7:
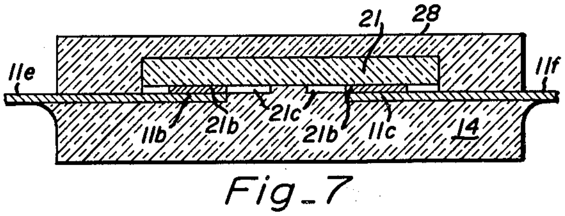
FIG. 7 is an elevational view, partly in section, illustrating the device and preform member after encapsulation.
Figure 8:
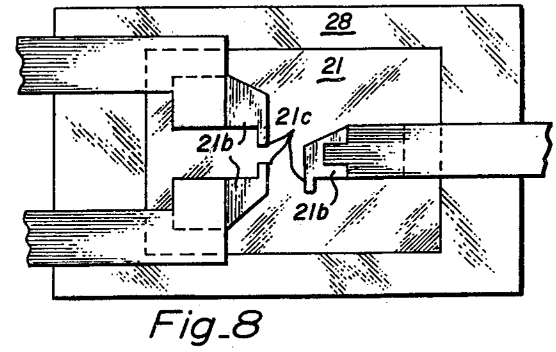
FIG. 8 is a plan view of the elements shown in FIG. 7.

Block 28 is placed on the assembly, as shown in FIGS. 7 and 8, with device 21 located in recess 28*a*. Block 28 is then sealed to the assembly by any suitable means, such as by passing a torch around the lower edge of block 28 to form a glass-to-glass seal with block 14 and a glass-to-metal seal with preform leads 11*a*, 11*b*, 11*c*. Alternatively, a low temperature frit may be applied to the underside of block 28 and fired after placing block 28 on the assembly, thereby sealing block 28 to the assembly. This latter method has the advantage of avoiding temperatures which might damage or modify the properties of the semiconductor device 21. The heat sealing operation may be carried out in an inert atmosphere, but this is not essential since pads 21*b* and tip portions 11*a*, 11*b*, 11*c* have already been welded together so that oxidation of these elements is no longer a major problem.

After this sealing operation, the assembly is completely encapsulated in glass so that there is no possibility of failure due to shock loading. The preform material may then be cut away externally of the encapsulated package to separate the end portions 11*d*, 11*e*, 11*f* of the lead members for connection to the external circuits.

Figure 9:
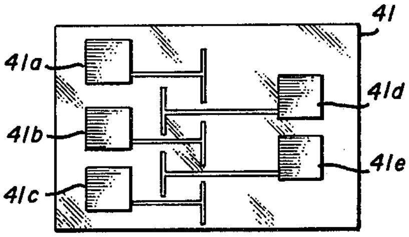
FIG. 9 is a plan view of a typical semiconductor device on which interconnections are to be made.

The foregoing description related to the use of the novel preform members and welding technique of this invention to connect a miniature circuit element or device to lead members for making external circuit connections. In the event that there are a number of such connections to make, either for a given device or between devices, the space available may become inadequate to lay out the necessary leads without shorting thereof. To solve this problem, the technique described below may be employed to provide cross-over interconnections. Referring to FIG. 9, assume that the semiconductor device 41 shown there has bonding pads 41*a*, 41*b*, 41*c*, 41*d* and 41*e* provided thereon and connected to the circuit elements within the device, and that it is desired to connect pad 41*c* to pad 41*d*. From FIG. 9, it will be seen that any connection, made in accordance with the ball bonding techniques discussed above, and made directly between pads 41*c*, 41*d* across the surface of the device, will have to cross and hence short out a number of the conductors already laid out on the device. Further, any surface interconnection which connected pads 41*c*, 41*d* without crossing over the established metal pattern would have to go completely outside the pad area near the edges of the device, thus resulting in a lengthy electrical path.

Figure 10:
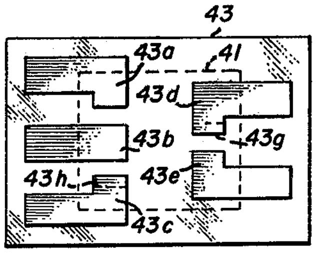
FIG. 10 illustrates a primary substrate in accordance with this invention, showing the primary metal pattern thereon.
Figure 13:
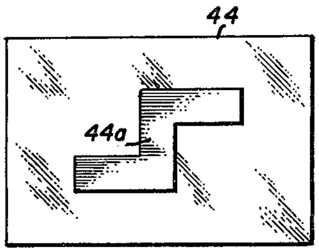
FIG. 13 is a plan view of a secondary substrate in accordance with this invention, showing the secondary metal pattern thereon.

To provide for such interconnection without crossing the established metal pattern and without producing a lengthy path around the pads, a primary substrate 43 as shown in FIG. 10 and a secondary substrate 44 as shown in FIG. 13 are employed in accordance with this invention. Substrates 43, 44 are made of any suitable material, such as glass, which is transparent to the high energy beam used to perform the welding.

Figure 11:
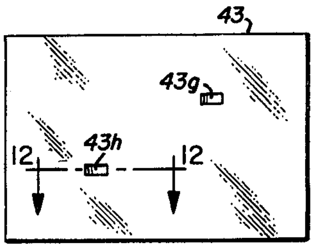
FIG. 11 is a plan view of the primary substrate showing the openings therein for connecting to the secondary metal pattern.
Figure 14:
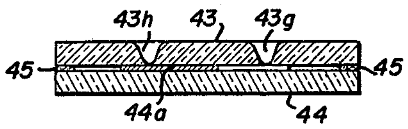
FIG. 14 is an elevation view in cross section showing the placement of the primary substrate relative to the secondary substrate.
Figure 12:
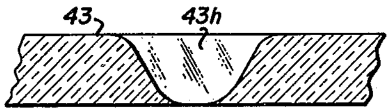
FIG. 12 is an elevation view, on an enlarged scale, along line 12—12 of FIG. 11, showing the preferred shape of the openings in the primary substrate.

Primary substrate 43 will ultimately have placed thereon a lead pattern represented by leads 43*a*, 43*b*, 43*c*, 43*d*, 43*e*, as shown in FIG. 10, and these leads will be connected to the corresponding pads on device 41 by means of the laser welding technique described above. However, prior to the deposition of this lead pattern on primary substrate 43, it is first provided with a pair of openings therein 43*g*, 43*h*, as shown in FIG. 11. These openings may be formed by any suitable technique, and the ideal opening configuration is shown in FIG. 12, with gently sloping sides from top to bottom. Openings 43*g*, 43*h* are located on primary substrate 43 so that they are aligned with the ends of a secondary metal pattern 44*a* on secondary substrate 44 when substrate 43 is placed on substrate 44, as shown in FIG. 14. This secondary metal pattern 44*a* serves to interconnect leads 43*c*, 43*d* on primary substrate 43. The requirements for the location of openings 43*g*, 43*h* and secondary metal pattern 44*a* are that the secondary interconnect conductor 44*a* must not pass over an area which will be used for bonding to the device or to the package, and that the secondary interconnect pattern must lie below the points in the primary circuit which are to be connected. It will be seen from FIGS. 10, 13 and 14 that both of these requirements are met, since openings 43*g*, 43*h* and the ends of the secondary metal pattern lie under the primary metal pattern in an area away from that in which welding will be performed to bond the primary metals leads to the device pads. This first requirement is necessary, of course, so that the laser or other high energy beam utilized for the welding may pass through the substrates without striking or damaging the secondary metal pattern.

The primary and secondary substrates are placed together so that the bottom face of the primary substrate is pressed against the metal pattern 44*a* of the secondary substrate and with openings 43*g*, 43*h* aligned with the ends of the secondary metal pattern, as seen in FIG. 14. The substrates are then bonded firmly together in this position by means of cement, welding, a low temperature frit, or any other suitable means, as represented by bonding material 45 in FIG. 14. It will be understood that at this point, primary substrate 43 has only the openings 43*g*, 43*h* therein and does not yet have the primary metal pattern 43*a*–43*e*.

Figure 15:
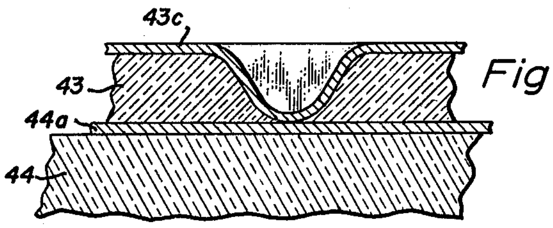
FIG. 15 is an enlargement of a portion of FIG. 14 showing the bonding of the secondary metal pattern to the primary metal pattern through an opening in the primary substrate.

The next step in the technique is to apply the primary metal pattern to the secondary metal pattern 44*a* through openings 43*g*, 43*h*. The application of this metal pattern may be by means of standard evaporation techniques and masking procedures which prouce the desired pattern. During this deposition, the deposited metal will flow into openings 43*g*, 43*h* into contact with the ends of secondary metal pattern 44*a* and will thus produce an atomic weld of the deposited primary metal with the secondary metal, as shown in FIG. 15. Special care must be exercised during this procedure to avoid oxidizing the metal connection strips to prevent subsequent difficulties in making connections to these strips. Preferably, the operation is performed in a controlled atmosphere free of oxygen, but engineering practicalities may necessitate other approaches to this control. An operation which could be taken to assure a good electrical contact or further improve the electrical characteristics of the connection would be an alloying operation in a controlled atmosphere.

Figure 16:
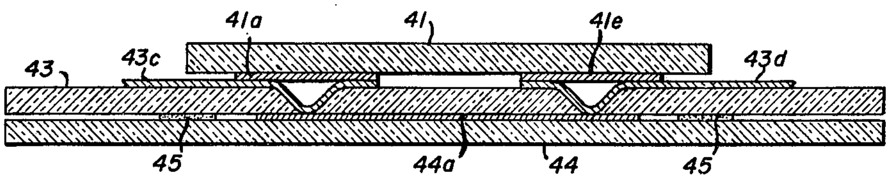
FIG. 16 is an elevation view, partly in cross section, showing the positioning of the semiconductor device of FIG. 9 relative to the primary and secondary substrates.

Upon completion of this step, the primary metal pattern of leads 43*c*, 43*d* is electrically connected to the ends of secondary pattern 44*a* through openings 43*g*, 43*h*. The next step is to place device 41 on primary substrate 43 and bond the device pads to the ends of the primary metal pattern leads, as shown in FIG. 16. This bonding is accomplished by passing a laser or other high energy beam through secondary substrate 44 and primary substrate 43 to strike the back of the tips of primary leads 43*a*–43*e* to weld these tips to the device pads 41*a*–41*e* in a manner similar to that described above. It will be recalled that the secondary metal pattern 44*a* is positioned so that it does not interfere with the passage of the high energy beam through the substrates to the areas to be welded. It will be noted that a plurality of devices and secondary substrates could be used to interconnect in any manner any number of devices and circuit points.

Figure 17:
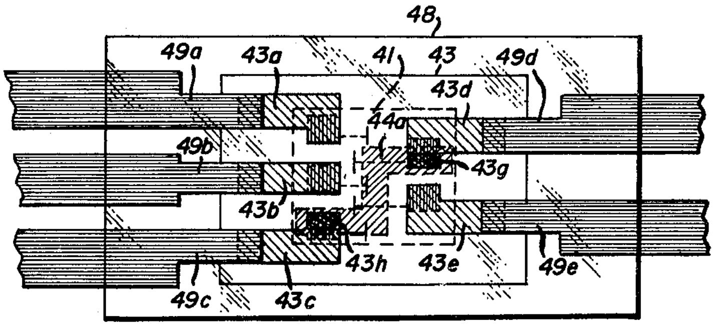
FIG. 17 is a plan view showing the placing of a block member-preform member structure on the assembly of FIG. 16.

The next step in the fabrication is to place a glass cover on the assembly, the glass cover having preform lead members therein as discussed above, to provide connection to the primary metal pattern on the primary substrate 43. As shown in FIG. 17, a glass member 48 is provided having preform lead members 49*a*, 49*b*, 49*c*, 49*d*, 49*e* therein. These lead members may be placed in the glass member in accordance with the techniques discussed above in connection with FIGS. 1–3. Glass member 48 is placed on the assembly, with the tips of preform lead members 49*a*–49*e* in contact with the ends of the primary metal pattern leads 43*a*–43*e*.

Figure 18:
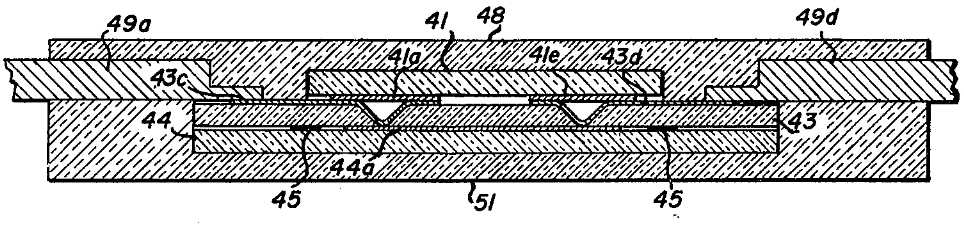
FIG. 18 is an elevation view, partly in cross section, illustrating the relationship among the elements of the structure of FIG. 17.

After placing the preform lead members 49*a*–49*e* in contact with the corresponding primary metal leads, these members are welded together by passing a laser or other high energy beam through member 48 to strike the preform lead members and weld them to their corresponding primary leads. As before, this welding may be performed sequentially on each of the junctions to be welded, or may be performed simultaneously for all junctions through the use of beam splitting techniques or multiple beams or both. A bottom glass member 51 (FIG. 18) which is sealed to upper member 48 may be provided to completely enclose the package. The resulting package would then appear as shown in cross section in FIG. 18.

The fabrication techniques discussed above are adaptable to automatic, semi-automatic or manual processing, and such automatic or semi-automatic processing may be employed to reduce the time and labor involved. For such processing, the preform material is preferably used in roll or sheet form, and this sheet is processed through the fabrication steps. This preform material may be supplied either as a finished product, where the lead pattern has already been cut into the stock, or may be simply sheet stock. If sheet stock is used, the first step in the sequence would be to form the preform pattern in the strip stock (punch and die, electric discharge machining or other techniques will cut the desired lead pattern into the sheet material repeatedly as stock is fed into the machine). In this operation, tolerances can be held to 0.0002 of an inch, and indexing attachments can be used in conjunction with registration holes or marks so that the stock feed is continuous.

After leaving the machining operation, the stock is washed in solvent solutions to remove the dielectric fluids and/or other contaminants which may adhere to the preform material. The stock is then fed through an inert atmosphere furnace where it is mated with the glass block described above. This mating is accomplished by heating the glass block to a plastic stage so that it is of a low enough viscosity to flow around the lead pattern, as discussed above.

The assembly then proceeds through a conveyor system to a cooling area where the inert atmosphere is maintained. Upon lowering of the temperature of the assembly sufficiently, the semiconductor device is located properly, relative to the preform leads, and the high energy beam is passed through the glass to perform the desired welding.

To locate the device properly relative to the preform member, either manual or automatic techniques may be used. In the manual mode, an operator would examine the device position through a microscope or viewing screen, and would adjust the device position through three axis controls and a rotational control. The X and Y controls would be utilized to position the die relative to the preform leads, and the Z control would be utilized to press the device against the preform leads.

Figure 19:
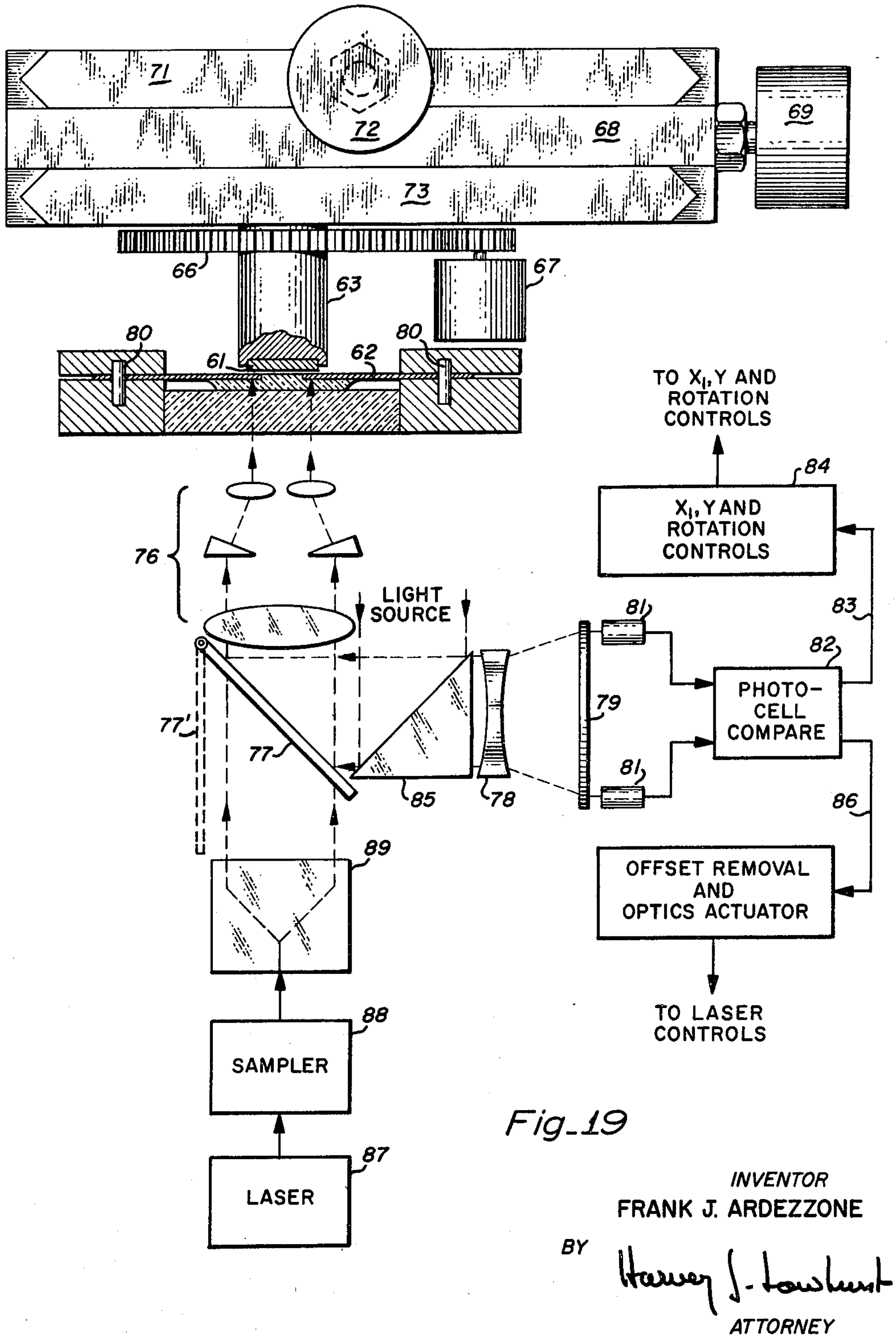
FIG. 19 is a schematic illustration of equipment for automatically or semi-automatically positioning a semiconductor device relative to a preform member for joining the cooperating portions thereof by welding.

For automatic or semi-automatic operation, equipment such as that shown schematically in FIG. 19 may be employed. In FIG. 19, a device 61 which is to be positioned relative to a preform member 62 for welding is carried by a device holder 63. Device 61 may be secured to holder 63 by any suitable means, such as vacuum, gravity or adhesive. Device holder 63 is movable in the X, Y and Z directions, as well as rotationally, to vary the position of device 61 relative to preform member 62 until the pads on device 61 are in the desired position relative to the tips of the lead members on preform member 62.

Holder 63 and device 61 may be rotated by rotation of a ring 66 driven by a rotation motor 67. The holder and attached device may be moved in the Y direction by means of a Y slide 68 which is driven by an actuator 69. This mechanism moves the slide 68 and holder 63 with attached device 61 over a predetermined distance or range in the Y dimension (which is across the sheet in the drawing). The device is driven in the X direction by a slide 71 driven by an actuator 72. This mechanism preferably drives the holder and attached device in predetermined increments in the X direction, as will be described more in detail below. A second dimension actuator (not shown) drives a second slide 73 to provide an offset in the X dimension for purposes of alignment, as will be discussed below.

To determine the position of the device relative to the preform member, suitable optical means may be employed. Such means may include focusing optics generally designated 76 for focusing light reflected from the pads of device 61 in holder 63. Light is supplied from a light source through a prism 85 to the focusing optics 76. The position detection system operates on the principle of detecting the light reflected back from the relatively bright and reflective pads on device 61. This light passes through a transparent support 75 on which preform member 62 is mounted. The positioning of the preform member may be controlled by pins 80 extending through the index or registration holes in the preform member.

Optics 76 focus the reflected light on a movable mirror 77 which is effective in the position shown in FIG. 19 to reflect this focused light through a diverging lens 78 to a screen 79. A plurality of photocells 81 are positioned behind screen 79 so as to be responsive to light falling on selected portions of the screen. The photocells are positioned relative to the screen over the areas which will correspond to the pad areas on the device when the device is properly positioned relative to the preform. Maximum light reaches the photocells when and only when these pads are in the desired position relative to preform 62 and thus reflecting maximum light. In this connection, it will be understood that if the device pads were positioned directly over the preform lead tips during this stage, then these tips would block light from the pads so that there would be no reflected light from the pads to serve as a guide in positioning the device. Hence, the offset discussed above is employed, so that during the positioning operation, the device pads are actually offset slightly from their desired position so that light may be reflected therefrom to the position sensing equipment including screen 79 and photocells 81. After maximum light is detected from the pads, the position sensing operation is completed and welding may commence after removal of the offset distance by actuation of the offset X slide 73 by its associated actuator.

The output from photocells 81 is supplied to a photocell comparator network 82 where the outputs are compared to determine when maximum output exists from all photocells. If maximum output is not detected, an output signal is sent on a conductor 83 to a control network 84 which controls the X, Y and rotation drives.

These drives are preferably operated in the following manner when a maximum photocell output is not detected. The drive motor 67 rotates ring 66 to rotate holder 63 and device 61 through 90 degrees, and the Y drive actuator 69 then drives Y slide 68 from one end of its range of movement to the other. If a maximum photocell output is not detected during this motion, the X actuator 72 steps X slide 71 one increment of movement and the traverse of the Y slide is repeated. If no maximum photocell output is reached, this action continues sequentially for each increment of movement of the X slide 71. If there is still no maximum photocell output, ring 66 is rotated another 90 degrees and this procedure is repeated. After four such rotations of ring 66 and the accompanying X and Y movements, all possible positions of device 61 will have been scanned so that a maximum photocell output will be received at some point during the operation. It will be understood that the pattern of the pads on device 61 and the position of photocells must be chosen such that there is only one position of the pads at which maximum photocell output can be produced. Should a situation exist where, due to the high density of pads on the device, there will be more than one or many device positions which will indicate a maximum output to the photocells and changing device configuration would be impractical, then the device may be provided with one or more functional reflecting pads which will be used only for alignment and will have only one possible maximum positive read position.

When the maximum photocell output is received by network 82, output line 86 is energized to energize network 90. This action energizes the offset actuator to drive offset slide 73 to remove the offset of device 61. This positions the device pads directly over the tips of the lead members of the preform and actuates the optics system so that welding may take place.

Mirror 77 will be swung out of the optical path at this time so that the beam from a laser 87 may be projected through the focusing optics 76 to the junctions to be welded. This laser beam may first pass through a sampler 88 to measure the energy level and a beam splitter 89 to provide two beams for simultaneous welding of the two junctions involved. Although only two junctions to be welded are shown in FIG. 19, it will be understood that any suitable number of such junctions may be positioned and welded in accordance with this invention.

Although the invention has been illustrated with the preform member surrounded by the insulating member on three surfaces, it will be apparent that the preform member could be secured to the glass without being imbedded therein. Additionally, although the invention has been illustrated relative to the connection or interconnection of one semiconductor device, it will be clear that the teachings may be applied with equal facility to the connection or interconnection of a plurality of such devices.

What is claimed is:

1. A method of packaging semiconductor devices having a plurality of electrical connection pads thereon, comprising the steps of:
   forming an electrically conductive preform member having a plurality of electrical lead portions;
   securing said preform member to an optically transparent material with one surface of said preform member forming a flush surface;
   positioning said device adjacent said flush surface of said preform member with the pads of said device in engagement with said lead portions; and
   welding said lead portions to said pads by passing a high energy beam through said optically transparent material to strike said lead portions.

2. The method of claim 1 in which said preform member is encased in said transparent material on three surfaces, with the fourth surface of said preform member flush with a surface of said transparent material.

3. The method of claim 1 including the step of applying a sealing member over said device after said welding to completely seal said device and said lead portions.

4. The method of claim 1 in which said welding is performed by passing a plurality of high energy beams through said transparent material to simultaneously weld all of said lead portions to said pads.

5. The method of claim 1 in which said high energy beam is a laser beam.

6. A method of packaging semiconductor devices having a plurality of electrical connection pads thereon, comprising the steps of:
   forming an electrically conductive preform member having electrical lead portions corresponding to the configuration of said pads on said device;
   encasing said preform member on three surfaces in an optically transparent material, with the fourth surface of said preform member flush with a surface of said optically transparent member;
   positioning said device in contact with said flush surface of said preform member with said paids in engagement with said corresponding lead portions of said preform member; and
   welding said pads to said lead portions by passing a high energy beam through said optically transparent material to strike said lead portions and heat said lead portions and said pads sufficiently to weld them together.

7. The method of claim 6 including the step of applying a sealing member to said device to completely seal said device and said lead portions.

8. The method of interconnecting selected ones of the pads of a semiconductor device, comprising the steps of:
   forming a primary substrate member having a plurality of openings extending therethrough;
   forming a secondary substrate having a conductive pattern corresponding to the interconnections to be made between the selected pads of said device;
   positioning said primary substrate adjacent said secondary substrate with said openings positioned over said conductive pattern of said secondary substrate;
   forming a conductive lead pattern on said primary substrate corresponding to the pattern of pads on said device, selected portions of said conductive lead pattern extending through said openings in said primary substrate to make electrical connection with said conductive pattern of said secondary substrate;
   positioning said device with the pads thereof in contact with said lead pattern of said primary substrate; and
   bonding said pads to said conductive lead pattern of said primary substrate, whereby said selected pads are interconnected through said conductive pattern of said secondary substrate.

9. The method of claim 8 in which said primary substrate and said secondary substrate are of optically transparent material, and said bonding is performed by passing a high energy beam through said secondary and said primary substrates to strike the junctions of said conductive lead pattern of said primary substrate and said pads of said device.

10. The method of claim 9 in which said bonding is performed by passing a plurality of high energy beams through said secondary and said primary substrates to simultaneously strike all of said junctions.

11. The method of claim 8 in which said conductive lead pattern is formed by depositing a layer of metal on said primary substrate and in said openings, and selectively removing portions of said deposited layer to produce said conductive lead pattern.

References Cited

UNITED STATES PATENTS

| | | | |
|---|---|---|---|
| 3,178,804 | 4/1965 | Ullery et al. | 29—577 |
| 3,220,095 | 11/1965 | Smith | 29—589 X |
| 3,292,241 | 12/1966 | Carroll | 29—577 |
| 3,340,601 | 9/1967 | Garibotti | 29—577 |
| 3,349,481 | 10/1967 | Karr | 29—588 X |

PAUL M. COHEN, Primary Examiner

U.S. Cl. X.R.

29—588, 589; 174—52; 219—121; 228—49